United States Patent [19]
Wetherell

[11] Patent Number: 5,557,242
[45] Date of Patent: Sep. 17, 1996

[54] METHOD AND APPARATUS FOR DIELECTRIC ABSORPTION COMPENSATION

[75] Inventor: John T. Wetherell, Ft. Lauderdale, Fla.

[73] Assignee: Motorola, Inc., Schaumburg, Ill.

[21] Appl. No.: 445,484

[22] Filed: May 22, 1995

[51] Int. Cl.[6] .................................................. H03L 7/093
[52] U.S. Cl. ............................ 331/17; 327/341; 361/272
[58] Field of Search ............................... 331/17; 327/341; 361/272, 275.1

[56] References Cited

U.S. PATENT DOCUMENTS

| | | | |
|---|---|---|---|
| 4,211,981 | 7/1980 | Lerma | 327/341 |
| 4,267,503 | 5/1981 | Westra | 324/659 |
| 4,663,586 | 5/1987 | Swerlein et al. | 324/115 |
| 5,379,002 | 1/1995 | Jokura | 331/10 |

*Primary Examiner*—Siegfried H. Grimm
*Attorney, Agent, or Firm*—Barbara R. Doutre

[57] ABSTRACT

A dielectric absorption compensation circuit (300) provides an equivalent and opposite impedance to a parasitic impedance of an external capacitive load (414). The dielectric absorption compensation circuit (300) reduces lock time in a phase lock loop circuit (400) which uses an RC filter (410) including the capacitive load (414).

16 Claims, 3 Drawing Sheets

METHOD AND APPARATUS FOR DIELECTRIC ABSORPTION COMPENSATION

TECHNICAL FIELD

This invention relates in general to electronic circuits and more specifically to dielectric absorption compensation of electronic circuits.

BACKGROUND

Dielectric absorption can be modeled as a parasitic ladder in parallel with an ideal capacitor as shown in FIG. 1 of the accompanying drawings. The equivalent circuit model 100 comprises ideal capacitor 102, parasitic resistor, Rp, 104, and parasitic capacitor, Cp, 106.

Prior art negative impedance converters, such as the circuit shown in FIG. 2, can reduce the effects of dielectric absorption. The prior art negative impedance converter 200 includes an operational amplifier (op amp) 202 having an impedance 204 fed back between its positive terminal 206 and its output port 208. The disadvantage associated with this type of negative impedance converter is that the input voltage is typically doubled at the output port. Another means of reducing dielectric absorption is to design circuits with low dielectric absorption capacitors, however, these tend to be physically large and costly.

In phase lock loop (PLL) circuits using filtering capacitors (also known as loop capacitors), dielectric absorption can cause existing lock times of 2–3 milliseconds (ms) to increase by as much as 50–100 percent. The effect of dielectric absorption in PLL circuits is primarily seen during a stepped voltage at the filter capacitor which corresponds to a stepped frequency. For example, a stepped voltage of a half volt at the filter capacitor can correspond to a stepped frequency of approximately 3 megahertz (MHz). When the operating frequency of the PLL is changed, the stepped frequency takes time to settle to the final desired operating frequency and this is referred to as the lock time of the PLL. The slow time constant of the parasitic resistor and parasitic capacitor associated with the filter capacitor's dielectric absorption prevents the PLL from settling quickly. For small frequency steps, typically steps of 2 MHz or less the effects of dielectric absorption are usually considered negligible. However, for large frequency steps, usually greater than 3 MHz, more charge has to be transferred to or from the parasitic capacitor causing the lock time to be degraded.

Hence, there is a need for an apparatus and technique for reducing dielectric absorption in electronic circuits, particularly phase lock loop circuits.

DETAILED DESCRIPTION OF THE PREFERRED EMBODIMENT

Figure 1:
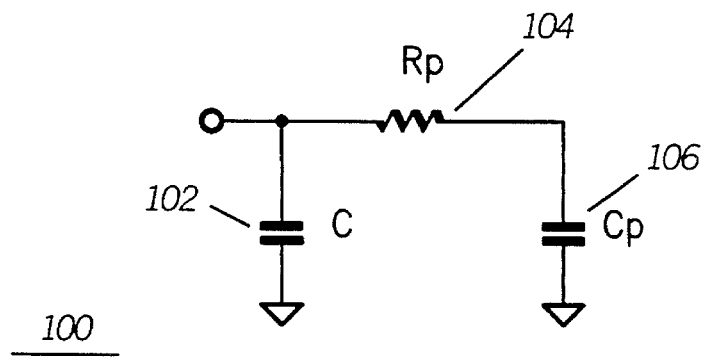
FIG. 1 shows a prior art model representing dielectric absorption of a capacitor.
Figure 2:
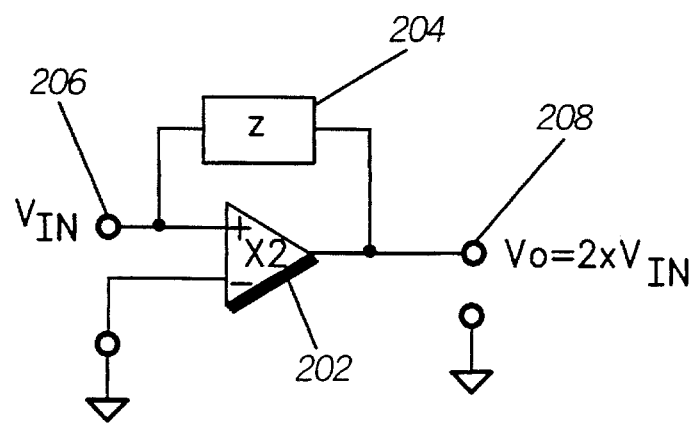
FIG. 2 is a prior aft negative impedance circuit.
Figure 3:
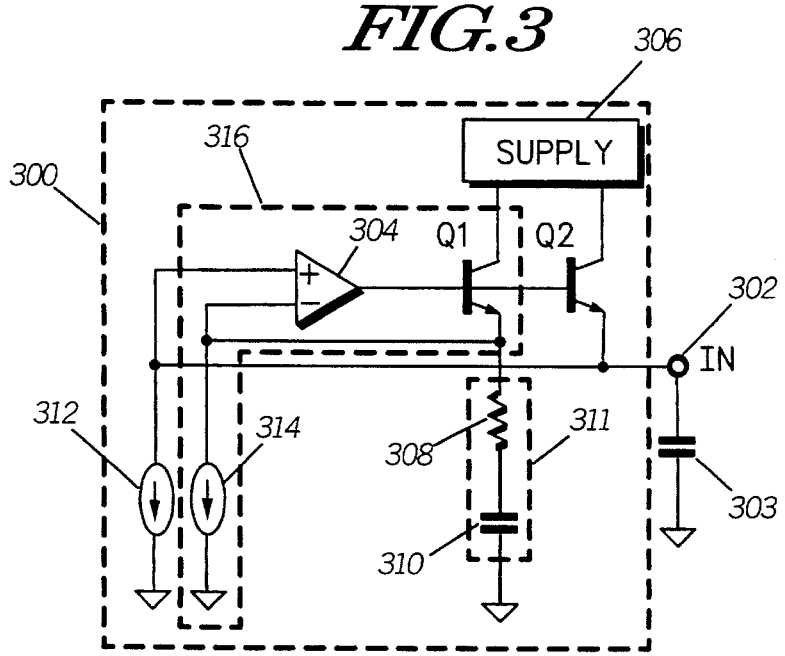
FIG. 3 is a dielectric absorption compensation circuit in accordance with the present invention.

Referring to FIG. 3, there is shown a dielectric absorption compensation circuit 300 coupled to an external capacitive load 303 in accordance with the present invention. Compensation circuit 300 receives a DC voltage through input port 302 which represents a voltage presented by the external capacitive load 303 having a parasitic capacitance and resistance associated therewith. Compensation circuit 300 includes operational amplifier 304 having inverting and noninverting inputs, and an output. First and second transistors Q1 and Q2, shown as npn bipolar transistors, are coupled through their collectors to supply 306, through their bases to the output terminal of op amp 304, and through their emitters to the op amp's inverting and noninverting inputs respectively. The emitters of transistors Q1 and Q2 are also coupled to substantially equivalent current sinks 314 and 312 respectively, to form first and second current controlled current sources. A load impedance 311 is coupled to the emitter of transistor Q1 and preferably comprises an RC load including resistor 308 and capacitor 310. The values of resistor 308 and capacitor 310 are selected to be substantially similar to the parasitic capacitance and resistance associated with the external capacitive load 303. The external capacitive load 303 is coupled to the second current source and to the emitter of transistor Q2.

The operational amplifier 304 and the first current controlled current source (transistor Q1 and current sink 314) form a unity gain buffer circuit 316 where the second current controlled current source (transistor Q2 and current sink 312) is coupled in the feedback path of the buffer circuit between the noninverting terminal and the output of op amp 304. Inverting and noninverting inputs of buffer 316 coincide with the inverting and noninverting inputs of op amp 304. The second current controlled current source (Q2 and current sink 312) coupled to the noninverting input of the unity gain buffer circuit 316 and to the external capacitive load 303 is referenced to the current through the resistive capacitive impedance 308/310. When a transient is detected at the noninverting terminal of op amp 304 it gets fed back to the inverting input through transistor Q1 to force the voltages at the inverting and noninverting inputs of op amp 304 to be substantially equal. When a voltage change (transient) occurs at external capacitive load 303 this change will be reflected through the op amp negative feedback and sensed by the resistor 308 and capacitor 310.

Positive transients occur when the DC voltage on the external capacitive load 303 changes from a lower voltage to a higher voltage. When a positive transient occurs current will flow to the RC load 308/310 through the emitter of transistor Q1. The total current sourced by transistor Q1 when a positive transient is detected includes the current drawn by current sink 314 and the current drawn through the RC load 308/310. This current is then mirrored from transistor Q1 to transistor Q2. Transistor Q2 then sources the external capacitive load 303 with substantially the same current as that drawn by the RC load 308/310.

Negative transients occur when the DC voltage on the external capacitive load 303 changes from a higher voltage to a lower voltage. When a negative transient is detected current will discharge from the external capacitive load 303 through current sink 312.

Current will only be sourced through the RC load 308/310 when a positive transient is detected at external capacitive load 303. During non nontransient periods of operation, transistor Q2 sources substantially the same current as transistor Q1 to prevent current from being transferred to or from the external capacitive load 303.

Hence, the dielectric absorption compensation circuit 300, as described by the invention, sources current when positive transients are detected and sinks current when negative transients are detected at an external capacitive load 303. The dielectric absorption compensation circuit 300 generates a negative impedance to counterbalance the positive impedance associated with the parasitic capacitance and parasitic resistance of the external capacitive load 303.

Figure 4:
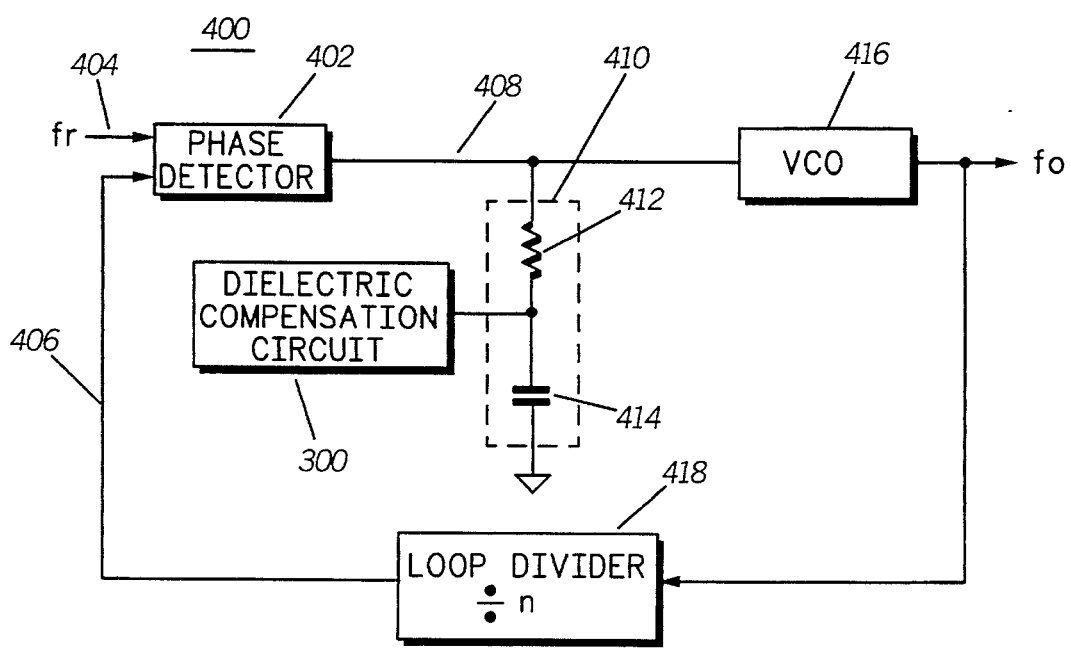
FIG. 4 is a block diagram of a phase lock loop circuit in accordance with the present invention.

Referring now to FIG. 4, there is shown a phase lock loop circuit 400 in accordance with the present invention. The phase detector receives first and second input frequencies 404, 406 and phase compares them in order to generate a current signal 408 which is proportional to the phase error between the two input frequencies. A low pass filter 410 is coupled to the output of the phase detector 402 forming a second order loop. The low pass filter 410 filters noise associated with the output of the phase detector 402. Low pass filter 410 includes filter resistor 412 coupled in series to filter capacitor 414. A parasitic resistance and parasitic capacitance (not shown) is associated with the dielectric absorption of filter capacitor 414. In accordance with the present invention, dielectric absorption compensation circuit 300 is coupled in parallel to the filter capacitor 414. A voltage controlled oscillator 416 generates an output frequency in response to the current signal 408. The output frequency is fed back to a loop divider 418 where it is divided down and provided back to the phase detector 402 as the second input frequency signal 406.

When the loop divider 418 is changed to reset the output frequency, $f_o$, the DC voltage at loop capacitor 414 will also change. Initially the second input frequency 406 changes, for example from 120 megahertz (MHz) to 140 MHz, causing an initial transient response at the output frequency, $f_o$. The transient response at the output frequency, $f_o$, is detected at filter capacitor 414 by a change in DC voltage. The slow time constant of the parasitic resistor and parasitic capacitor associated with the filter capacitor 414 is now compensated by the negative impedance presented by the dielectric absorption compensation circuit 300. The filter capacitor 414 gets charged (for positive transients) or discharged (for negative transients) quickly thus significantly reducing the transient response. The phase lock loop circuit 400 can thus lock on the desired operating frequency, fo, more quickly. When the loop settles, the output frequency, $f_o$, is equivalent to the loop divider ratio, n, multiplied by the input frequency, $f_r$.

In the preferred embodiment of the invention the phase detector 402 and loop divider 418 are integrated within a single integrated synthesizer circuit. With the exception of resistor 308 and capacitor 310, the circuitry of dielectric absorption compensation circuit 300 can also be integrated into this same synthesizer IC. This alleviates any additional parts count to a radio board while reducing overall cost.

Figure 5:
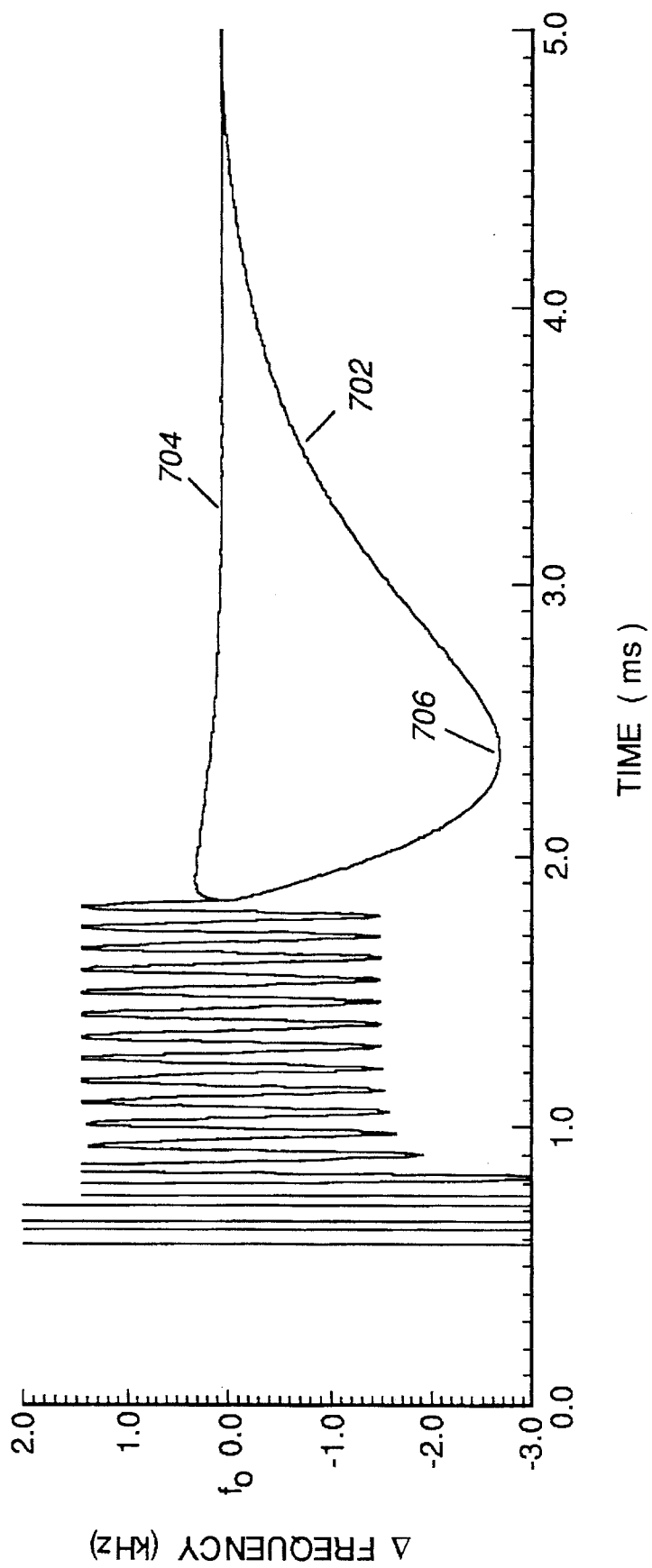
FIG. 5 is a graph comparing simulated lock times versus frequency for a phase lock loop with and without the dielectric absorption compensation circuit in accordance with the present invention.

Referring now to FIG. 5, there is shown a graph comparing simulated transient response times for a phase lock loop with and without the dielectric absorption compensation circuit as described by the invention. The response shows changes in the desired operating frequency, $f_o$, in kilohertz (kHz) versus time in milliseconds (ms). For this simulation, a voltage step of 9 volts to 6 volts corresponded to a frequency change of 15 megahertz which was applied to a filter capacitor of 1 microfarad. The filter capacitor was characterized by a parasitic resistance of approximately 1.4 megaohms and a parasitic capacitance of 20 nanofarads. The dielectric absorption compensation circuit modeled in accordance with the present invention used current sinks of 10 microamps each and an RC impedance of substantially equal values to those of the parasitic RC values. Waveform 702 represents the PLL without the dielectric absorption compensation circuit and waveform 704 represents the PLL with the dielectric absorption compensation circuit as described by the invention. This particular simulation demonstrated the effects of the compensation circuit in accordance with the present invention in overcoming a negative transient 706. The lock time for waveform 702 (no compensation) to a frequency accuracy of fo+100 Hz measured approximately 4.5 ms. The lock time of waveform 704 (with compensation) to a frequency accuracy of fo+100 Hz measured approximately 2 ms. Therefore, an overall improvement of over 40 percent was achieved in this particular simulation using the dielectric absorption compensation circuit in accordance with the present invention. Hence, improved lock times can be achieved by using the dielectric absorption compensation circuit.

Accordingly there has been provided a dielectric absorption compensation circuit 300 which behaves as a negative impedance to source or sink current in response to transients detected from an external capacitive load. Phase lock loop circuits can employ the dielectric absorption compensation circuit, as described by the invention, to improve lock times incurred when switching between desired output frequencies.

While the preferred embodiments of the invention have been illustrated and described, it will be clear that the invention is not so limited. While current controlled current sources were shown using bipolar npn transistors, these sources can be implemented with other transistor devices, such as field effect transistors (FETs) with the op amp polarity taken into account. Current sinks 312, 314 could be removed if the dielectric absorption circuit were to be used only for only positive transient compensation. Numerous modifications, changes, variations, substitutions, and equivalents will occur to those skilled in the art without departing from the spirit and scope of the present invention as defined by the appended claims.

What is claimed is:

1. A method for reducing dielectric absorption of a filter capapitor in a phase lock loop circuit, comprising the steps of:

generating a negative impedance; and sourcing current to the filter capacitor from the negative impedance when a positive transient at the filter capacitor is detected.

2. A method for reducing dielectric absorption of a filter capacitor in a phase lock loop circuit as described in claim 1, wherein the step of generating a negative impedance includes the steps of:

determining a parasitic impedance associated with the filter capacitor;

generating the negative impedance to be substantially equivalent to the parasitic impedance associated with the filter capacitor; and coupling the negative impedance in parallel with said filter capacitor.

3. A method for reducing dielectric absorption of a filter capacitor in a phase lock loop circuit as described in claim 1, further comprising the step of sinking current from the filter capacitor to the negative impedance when a negative transient is detected at the filter capacitor.

4. A dielectric absorption compensation circuit for a capacitor having a parasitic resistance and a parasitic capacitance associated therewith, comprising:

a negative impedance circuit coupled in parallel to the capacitor for sourcing and sinking current to the capacitor, said negative impedance circuit comprising:

a unity gain buffer circuit having inverting and noninverting inputs and an output, said capacitor coupled to the noninverting input;

a resistive capacitive impedance substantially equivalent to the parasitic resistance and capacitance associated with the capacitor, said resistive capacitive impedance coupled to the output of the unity gain buffer circuit and to the inverting input of the unity gain buffer circuit; and a first current controlled current source coupled to the noninverting input of the unity gain buffer circuit and to the capacitor, the first current controlled current source being referenced to the resistive capacitive impedance.

5. A dielectric absorption compensation circuit for a capacitor as described in claim 4, wherein the unity gain buffer circuit comprises:

an operational amplifier having inverting and noninverting terminals and an output terminal, the noninverting terminal being coupled to the first current controlled current source; and a second current controlled current source coupled to the inverting terminal and the output terminal of the operational amplifier, the second current controlled current source mirroring its current to the first current source.

6. A dielectric absorption compensation circuit for a capacitor as described in claim 4, wherein the negative impedance circuit sources current through the first current controlled current source to the capacitor when a positive transient is detected at the capacitor.

7. A dielectric absorption compensation circuit for a capacitor as described in claim 5, wherein the negative impedance circuit sinks current through the second current source from the capacitor when a negative transient is detected at the capacitor.

8. A phase lock loop circuit, comprising:

a phase detector for receiving first and second input frequency signals and providing a phase detected signal;

a low pass filter coupled to the output of the phase detector, said low pass filter including a filter capacitor having a parasitic impedance associated therewith;

a dielectric absorption compensation circuit coupled in parallel to the filter capacitor and providing a substantially equivalent negative impedance to the parasitic impedance associated with the filter capacitor;

a voltage controlled oscillator generating an output frequency; and a loop divider for dividing the output frequency and feeding back the divided output frequency as the second input frequency signal to the phase detector.

9. A phase lock loop circuit as described in claim 8, wherein said dielectric absorption compensation circuit comprises:

a buffer circuit having inverting and noninverting inputs and an output, said filter capacitor coupled to the noninverting input; and a first current controlled current source coupled to the noninverting input of the buffer circuit and to the filter capacitor; and a predetermined impedance substantially equivalent to the parasitic impedance associated with the parasitic capacitor, said predetermined impedance coupled to the output of the buffer circuit and to the inverting input of the buffer circuit.

10. A phase lock loop circuit as described in claim 9, wherein the buffer circuit comprises:

an operational amplifier having inverting and noninverting terminals and an output terminal, the operational amplifier noninverting terminal being coupled to the first current controlled current source; and a second current controlled current source coupled to the inverting terminal and the output terminal of the operational amplifier, said second current controlled current source mirroring its current to the first current controlled current source.

11. A phase lock loop circuit as described in claim 8, wherein the dielectric absorption compensation circuit sinks current through the negative impedance from the filter capacitor when a negative transient is detected at the filter capacitor and the dielectric absorption compensation circuit sources current to the filter capacitor when a positive transient is detected at the filter capacitor.

12. A method for reducing dielectric absorption of a filter capacitor in a phase lock loop circuit, comprising the steps of:

determining a parasitic impedance associated with the filter capacitor;

generating a negative impedance which is substantially equivalent to the parasitic impedance associated with the filter capacitor; and coupling the negative impedance in parallel with said filter capacitor.

13. A method for reducing dielectric absorption of a filter capacitor in a phase lock loop circuit as described in claim 12, further comprising the step of:

determining the current through the parasitic impedance; and wherein the step of generating a negative impedance further comprises the steps of:

generating a first current source providing a current substantially equivalent to the current that was determined in the parasitic impedance;

mirroring the current to a second current source;

loading the second current source with the filter capacitor;

detecting a positive transient at the filter capacitor; and charging the filter capacitor through the second current source when a positive transient is detected.

14. A method for reducing dielectric absorption of a filter capacitor in a phase lock loop circuit as described in claim 13, further comprising the steps of:

detecting a negative transient at the filter capacitor; and sinking current from the filter capacitor to the first current source.

15. A method for reducing lock time of a phase lock loop circuit including a filter capacitor, comprising the steps of:

reducing the dielectric absorption associated with the filter capacitor, comprising the steps of:

determining an impedance associated with the filter capacitor;

generating a substantially equivalent and negative impedance to the impedance associated with the filter capacitor;

coupling the substantially equivalent and negative impedance in parallel with the filter capacitor;

detecting a positive transient at the filter capacitor; and sourcing current to the filter capacitor from the negative impedance when a positive transient is detected.

16. A method for reducing lock time of a phase lock loop circuit including a filter capacitor as described in claim 15, further comprising the steps of:

detecting a negative transient at the filter capacitor; and sinking current from the filter capacitor to the negative impedance when a negative transient is detected.

\* \* \* \* \*